US012644939B2

(12) United States Patent
Chen et al.

(10) Patent No.: US 12,644,939 B2
(45) Date of Patent: Jun. 2, 2026

(54) RESONANT POWER CIRCUIT, MAGNETIC RESONANCE IMAGING SYSTEM, AND TRANSFORMER

(71) Applicant: GE Precision Healthcare LLC, Waukesha, WI (US)

(72) Inventors: Yanan Chen, Beijing (CN); Haiyuan Sun, Beijing (CN); Gang Ma, Beijing (CN); Tao He, Beijing (CN); Sun Lu, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 186 days.

(21) Appl. No.: 18/640,637

(22) Filed: Apr. 19, 2024

(65) Prior Publication Data

US 2024/0353510 A1      Oct. 24, 2024

(30) Foreign Application Priority Data

Apr. 20, 2023    (CN) .......................... 202310431041.5

(51) Int. Cl.
| | |
|---|---|
| *G01V 3/00* | (2006.01) |
| *G01R 33/36* | (2006.01) |
| *G01R 33/385* | (2006.01) |
| *H01F 27/28* | (2006.01) |
| *H02M 1/00* | (2006.01) |
| *H02M 7/48* | (2007.01) |

(52) U.S. Cl.
CPC ..... *G01R 33/3614* (2013.01); *G01R 33/3852* (2013.01); *H01F 27/2804* (2013.01); *H02M 1/0058* (2021.05); *H02M 7/4815* (2021.05)

(58) Field of Classification Search
CPC ........... G01R 33/3614; G01R 33/3852; H02M 7/4815; H02M 1/0058; H01F 27/2804

USPC .......................................................... 324/318
See application file for complete search history.

(56) References Cited

U.S. PATENT DOCUMENTS 10,809,326 B2      10/2020    Wang

FOREIGN PATENT DOCUMENTS

| | | | | |
|---|---|---|---|---|
| AU | 2005314077 A1 | * | 6/2006 | ............. H10D 84/00 |
| AU | 2010284352 B9 | * | 7/2014 | ......... H02J 7/00034 |
| CN | 104734511 A | * | 6/2015 | ......... H02M 3/3353 |
| CN | 105652224 A | * | 6/2016 | |
| CN | 207099047 U | * | 3/2018 | |
| WO | WO-2006043248 A1 | * | 4/2006 | ......... H05B 41/2883 |
| WO | WO-2019171510 A1 | * | 9/2019 | ............. H02M 3/155 |

OTHER PUBLICATIONS

DE 102018213057 A (Jin) (Year: 2019).*

* cited by examiner

*Primary Examiner* — Walter L Lindsay, Jr.
*Assistant Examiner* — Frederick Wenderoth
(74) *Attorney, Agent, or Firm* — Fletcher Yoder, P.C.

(57) ABSTRACT

A resonant power circuit, a magnetic resonance imaging system, and a transformer are provided. The resonant power circuit is disposed within a scan room of a magnetic resonance imaging system, and is used for supplying power to a switch device in a radio-frequency amplifier of the magnetic resonance imaging system. The resonant power circuit includes: an inverter circuit, a resonant transformer circuit, and a rectifier circuit. The ratio of a resonant frequency is greater than 1 and less than a first threshold, a series resonant frequency being determined according to a resonant capacitor and a resonant inductor.

21 Claims, 6 Drawing Sheets

RESONANT POWER CIRCUIT, MAGNETIC RESONANCE IMAGING SYSTEM, AND TRANSFORMER

CROSS REFERENCE TO RELATED APPLICATIONS

The present application claims priority and benefit of Chinese Patent Application No. 202310431041.5 filed on Apr. 20, 2023, which is incorporated herein by reference in its entirety.

TECHNICAL FIELD

Embodiments of the present application relate to the technical field of medical devices, and relate in particular to a resonant power circuit, a magnetic resonance imaging system, and a transformer.

BACKGROUND

Magnetic resonance (MR) imaging systems are widely used in the field of medical diagnostics. Magnetic resonance systems generally have a main magnet, a gradient amplifier, a radio-frequency amplifier, a gradient coil, a transmit chain module, a transmit/receive coil, a receive chain module, etc. The transmit chain module generates a pulse signal and transmits the same to the transmit/receive coil. The transmit/receive coil generates a radio-frequency excitation signal to excite a scanned subject to generate a magnetic resonance signal. After the excitation ends, the magnetic resonance signal, after being spatially encoded, is acquired by the transmit/receive coil, and a medical image is reconstructed.

Currently, the gradient amplifier, a gradient coil assembly, the radio-frequency amplifier, and a radio-frequency coil assembly may all be disposed within a scan room of a magnetic resonance imaging system, and therefore, a power circuit for providing direct current electrical energy to a power switch device within the radio-frequency amplifier is also disposed in the scan room. However, commonly used power supply circuits are difficult to apply to high-frequency scenarios of the magnetic resonance imaging system. In addition, since transformers in commonly used power circuits use ferromagnetic substances, said power circuits are not suitable for operating in the strong magnetic field environment of the magnetic resonance imaging system.

SUMMARY

Embodiments of the present application provide a resonant power circuit, a magnetic resonance imaging system, and a transformer.

According to an aspect of the embodiments of the present application, a resonant power circuit is provided, the resonant power circuit being disposed within a scan room of a magnetic resonance imaging system, and used for supplying power to a switch device in a radio-frequency amplifier of the magnetic resonance imaging system. The resonant power circuit comprises: an inverter circuit, a resonant transformer circuit, and a rectifier circuit.

The inverter circuit is connected to the resonant transformer circuit and used for converting inputted direct current power into alternating current power to be outputted to the resonant transformer circuit.

Further, the resonant transformer circuit is used for resonantly converting and transforming the alternating current power, and then outputting the same to the rectifier circuit;

and the rectifier circuit is used for rectifying alternating current output voltages outputted by the resonant transformer circuit into direct current voltages for output, so as to supply power to the switch device.

The resonant transformer circuit comprises a resonant capacitor and a resonant inductor, and the ratio of a switching frequency to a series resonant frequency of the resonant power circuit is greater than 1 and less than a first threshold, the series resonant frequency being determined according to the resonant capacitor and the resonant inductor.

According to an aspect of the embodiments of the present application, a magnetic resonance imaging system is provided. The magnetic resonance imaging system comprises a main magnet for generating a main magnetic field; a gradient coil assembly; and a gradient amplifier for exciting the gradient coil assembly to generate a gradient magnetic field on a selected gradient axis so as to apply the gradient magnetic field to the main magnetic field. The magnetic resonance imaging system further includes a radio-frequency coil assembly; a radio-frequency amplifier for exciting the radio-frequency coil assembly to generate a radio-frequency signal; and the resonant power circuit of the preceding aspect. The resonant power circuit is disposed within a scan room of the magnetic resonance imaging system, and supplying power to a switch device in the radio-frequency amplifier.

According to an aspect of the embodiments of the present application, a multilayer flexible printed circuit or printed circuit board winding transformer is provided, comprising a primary winding and a secondary winding embedded in a multilayer flexible printed circuit or printed circuit board, wherein the primary winding and the secondary winding are respectively embedded in different layers of the multilayer flexible printed circuit or printed circuit board, central positions of a primary coil constituting the primary winding and a secondary coil constituting the secondary winding overlap, and the primary coil is located outside of the secondary coil and does not overlap with the secondary coil.

According to an aspect of the embodiments of the present application, a magnetic resonance imaging system is provided. The magnetic resonance imaging system comprises a main magnet for generating a main magnetic field; a gradient coil assembly; and a gradient amplifier for exciting the gradient coil assembly to generate a gradient magnetic field on a selected gradient axis so as to apply the gradient magnetic field to the main magnetic field.

The magnetic resonance imaging system further includes a radio-frequency coil assembly; a radio-frequency amplifier for exciting the radio-frequency coil assembly to generate a radio-frequency signal; and a power circuit disposed within a scan room of the magnetic resonance imaging system for supplying power to the radio-frequency amplifier or the gradient amplifier. The magnetic resonance imaging system also includes the multilayer flexible printed circuit or printed circuit board winding transformer of the preceding aspect, the multilayer flexible printed circuit or printed circuit board winding transformer being disposed in the power circuit.

One of the beneficial effects of the embodiments of the present application is that: by means of designing parameters of the resonant power circuit such that the ratio of the switching frequency to the series resonant frequency thereof is greater than 1 and less than the first threshold, the resonant power circuit is suitable for a high-frequency device in the scan room of the magnetic resonance imaging system, achieves operation in a ZVS mode in a full range of loads under open-loop conditions, and reduces the value of a drop in output voltages caused by a change in load, so that the output voltages are more stable.

One of the beneficial effects of the embodiments of the present application is that: by means of using the multilayer flexible printed circuit or printed circuit board winding transformer, respectively embedding the primary winding and the secondary winding in different layers of the multilayer flexible printed circuit or printed circuit board, and the primary coil being located outside of the secondary coil and not overlapping with the secondary coil, the problem in which conventional magnetic cores cannot operate in a strong magnetic field environment may be solved, and parasitic capacitance is reduced while good coupling between a primary side and a secondary side is achieved, thus, better suppression of electromagnetic interference can be obtained.

With reference to the following description and drawings, specific implementations of the embodiments of the present application are disclosed in detail, and the means by which the principles of the embodiments of the present application can be employed are illustrated. It should be understood that the implementations of the present application are therefore not limited in scope. Within the scope of the spirit and clauses of the appended claims, the implementations of the present application comprise many changes, modifications, and equivalents.

BRIEF DESCRIPTION OF THE DRAWINGS

The included drawings are used to provide further understanding of the embodiments of the present application, which constitute a part of the description and are used to illustrate the implementations of the present application and explain the principles of the present application together with textual description. Evidently, the drawings in the following description are merely some embodiments of the present application, and a person of ordinary skill in the art may obtain other implementations according to the drawings without involving inventive skill. In the drawings.

DETAILED DESCRIPTION

The foregoing and other features of the embodiments of the present application will become apparent from the following description and with reference to the drawings. In the description and drawings, specific implementations of the present application are disclosed in detail, and part of the implementations in which the principles of the embodiments of the present application may be employed are indicated. It should be understood that the present application is not limited to the described implementations. On the contrary, the embodiments of the present application include all modifications, variations, and equivalents which fall within the scope of the appended claims.

In the embodiments of the present application, the terms "first" and "second" etc., are used to distinguish different elements, but do not represent a spatial arrangement or temporal order, etc., of these elements, and these elements should not be limited by these terms. The term "and/or" includes any and all combinations of one or more associated listed terms. The terms "comprise", "include", "have", etc., refer to the presence of described features, elements, components, or assemblies, but do not exclude the presence or addition of one or more other features, elements, components, or assemblies.

In the embodiments of the present application, the singular forms "a" and "the", etc., include plural forms, and should be broadly construed as "a type of" or "a class of" rather than being limited to the meaning of "one". Furthermore, the term "the" should be construed as including both the singular and plural forms, unless otherwise specified in the context. In addition, the term "according to" should be construed as "at least in part according to . . . " and the term "on the basis of" should be construed as "at least in part on the basis of . . . ", unless otherwise specified in the context.

The features described and/or illustrated for one implementation may be used in one or more other implementations in the same or similar manner, be combined with features in other embodiments, or replace features in other implementations. The term "include/comprise" when used herein refers to the presence of features, integrated components, steps, or assemblies, but does not preclude the presence or addition of one or more other features, integrated components, steps, or assemblies.

Figure 1:
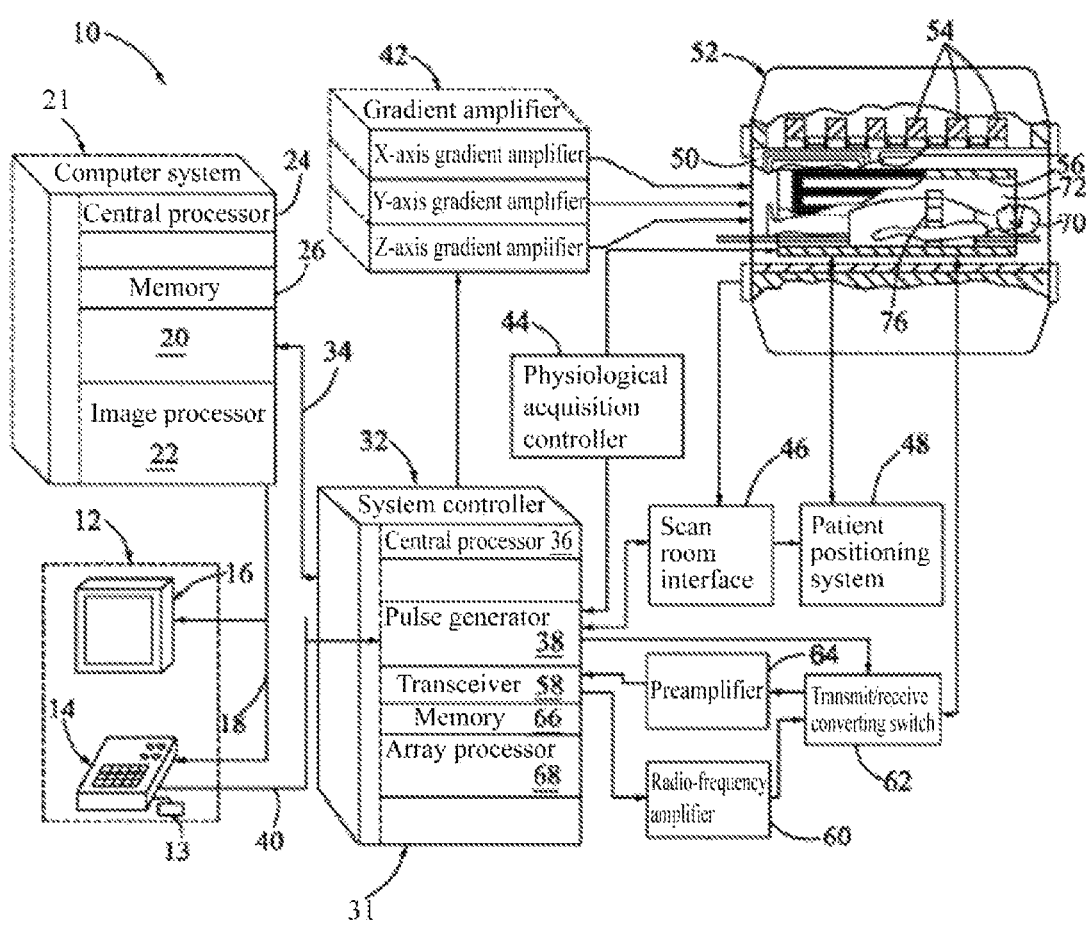
FIG. 1 is a schematic diagram of a magnetic resonance imaging system according to embodiments of the present application.

For ease of understanding, FIG. 1 shows a magnetic resonance imaging (MRI) system 10 according to some embodiments of the present invention.

The operation of the magnetic resonance imaging system 10 may be controlled from an operator console 12 that includes a keyboard or other input device 13, a control panel 14, and a display 16. The console 12 communicates with a computer system 20 by means of a link 18, and provides an interface to allow an operator to plan a magnetic resonance scan, displays a resulting image, performs image processing on the image, and archives data and images. The input device 13 may include a mouse, a joystick, a keyboard, a trackball, a touch screen, a light stick, a voice control device, or any similar or equivalent input device, and may be used for interactive geometric specification.

The computer system 20 includes a plurality of modules that communicate with each other by means of, for example, an electrical and/or data connection provided by using a backplane 21. The data connection may be a direct wired link or a wireless communication link, etc. The modules of the computer system 20 include an image processor 22, a central processor 24, and a memory 26. The memory 26 may include a frame buffer for storing an array of image data. In an alternative implementation, the image processor 22 may be replaced with image processing functions run on the central processor 24. The computer system 20 may be linked to an archive media device, a persistent or backup memory storage device, or a network. The computer system 20 may also communicate with a separate system controller 32 by means of a link 34.

In some embodiments, the system controller 32 includes a set of modules that communicate with one another by means of an electrical and/or data connection 31. The data connection 31 may be a wired link or a wireless communication link, etc. In an alternative implementation, the modules of the computer system 20 and the system controller 32 may be implemented on the same computer system or on a plurality of computer systems. The modules of the system controller 32 include a central processor 36 and a pulse generator 38 that is connected to the operator console 12 by means of a communication link 40.

In some embodiments, the pulse generator 38 may be integrated into a scanner device (for example, a resonance assembly 52). A system control computer 32 receives, by means of the link 40, a command from the operator indicating that a scanning sequence will be performed. By means of sending an instruction, command, and/or request describing the timing, strength, and shape of a radio-frequency pulse and pulse sequence to be generated as well as the timing and length of a data acquisition window, the pulse generator 38 operates a system component that emits (i.e., performs) a desired pulse sequence. The pulse generator 38 is connected to a gradient amplifier 42, so as to generate data referred to as gradient waveforms, and the gradient waveforms control the timing and shape of gradient pulses to be used during a scan.

In some embodiments, the pulse generator 38 may further receive data of a patient from a physiological acquisition controller 44 that receives signals from a plurality of different sensors connected to the patient, such as electrocardiogram signals from electrodes attached to the patient. The pulse generator 38 is connected to a scan room interface 46 that receives, from various sensors, signals associated with the conditions of the patient and a magnet system. A patient positioning system 48 also receives, by means of the scan room interface 46, a command to move a patient table to a desired location for scanning.

In some embodiments, the gradient waveforms generated by the pulse generator 38 are applied to the gradient amplifier 42. The gradient amplifier 42 includes an X-axis gradient amplifier, a Y-axis gradient amplifier, and a Z-axis gradient amplifier. Each gradient amplifier excites a corresponding physical gradient coil in a gradient coil assembly 50 and generates a magnetic field gradient pulse for use in spatially encoding the acquired signal. The gradient coil assembly 50 forms a portion of the resonance assembly 52, and the resonance assembly 52 includes a polarized superconducting magnet having a superconducting main coil 54. The resonance assembly 52 may include a whole-body radio-frequency coil 56, a surface or parallel imaging coil 76, or both. The coils 56, 76 of the radio-frequency coil assembly may be configured for transmission and reception, or transmission only, or reception only. A patient or imaged subject 70 may be positioned within a cylindrical patient imaging volume 72 of the resonance assembly 52. A transceiver 58 in the system controller 32 generates pulses that are amplified by a radio-frequency amplifier 60 and coupled to the radio-frequency coils 56, 76 by means of a transmit/receive switch 62. The resulting signals emitted by excited nuclei in the patient may be sensed by the same radio-frequency coil 56 and coupled to a preamplifier 64 by means of the transmit/receive switch 62. Alternatively, the signals emitted by the excited nuclei may be sensed by a separate receiving coil, such as a parallel coil or surface coil 76. The amplified magnetic resonance signals are demodulated, filtered, and digitized in a receiver portion of the transceiver 58. The transmit/receive switch 62 is controlled by a signal from the pulse generator 38 so as to electrically connect the radio-frequency amplifier 60 to the radio-frequency coil 56 during a transmit mode, and to connect the preamplifier 64 to the radio-frequency coil 56 during a receive mode. The transmit/receive switch 62 may further enable the use of a separate radio-frequency coil (e.g., the parallel or surface coil 76) in the transmit or receive mode.

The magnetic resonance signals sensed by the radio-frequency coil 56 or the parallel or surface coil 76 are digitized by the transceiver 58 and are transferred to a memory 66 in the system control computer 32. Generally, data frames corresponding to the magnetic resonance signals are temporarily stored in the memory 66 until they are subsequently transformed to create images. An array processor 68 uses known transform methods (most commonly Fourier transform) to create the images from the magnetic resonance signals. These images are transferred, by means of the link 34, to the computer system 20, and the images are stored in the memory in the computer system 20. In response to a command received from the operator console 12, the image data may be archived in a long-term storage device, or may be further processed by means of the image processor 22, transferred to the operator console 12, and presented on the display 16.

Unlike power supply modules in other fields, in the radio-frequency amplifier (when designed in the scan room) of the magnetic resonance imaging system, a power supply module needs to meet high frequency (for example, 1.4 M/2.8 M/1.5 T/3 T, etc.) requirements, and a circuit needs to be designed as a non-feedback open-loop circuit and be able to maintain a stable voltage output (for example, near −4 V/15 V) within a dynamically varying range of loads. Moreover, the circuit cannot have any magnetic components therein. However, commonly used power supply circuits are difficult to apply to high-frequency scenarios of the magnetic resonance imaging system. In addition, commonly used power circuits, due to transformers therein using ferromagnetic substances, are not suitable for operating in the strong magnetic field environment of the magnetic resonance imaging system.

For at least one of the above problems, embodiments of the present application propose a resonant power circuit, a magnetic resonance imaging system, and a transformer that are described below in connection with the embodiments.

Embodiments of the present application provide a resonant power circuit that is disposed within a scan room of a magnetic resonance imaging system, and is used for supplying power to a switch device in a radio-frequency amplifier of the magnetic resonance imaging system. A power device (switch device) within the radio-frequency amplifier includes an insulated gate bipolar transistor (IGBT) or a silicon carbide metal oxide semiconductor field effect transistor (SiC MOSFET), etc., and the embodiments of the present application are not limited thereto.

Figure 2:
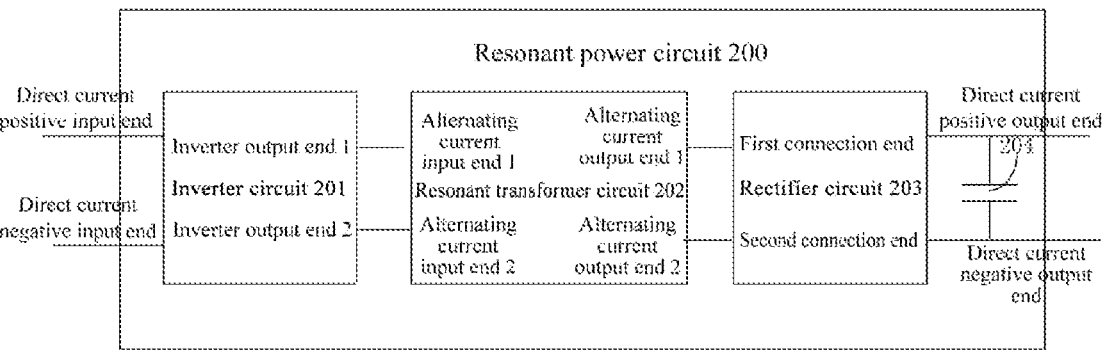
FIG. 2 is a schematic diagram of a resonant power circuit according to embodiments of the present application.

FIG. 2 is a schematic diagram of the resonant power circuit according to the embodiments of the present application. As shown in FIG. 2, the resonant power circuit 200 includes: an inverter circuit 201, a resonant transformer circuit 202, and a rectifier circuit 203.

The inverter circuit 201 is connected to the resonant transformer circuit 202 and used for converting inputted direct current power into alternating current power to be outputted to the resonant transformer circuit 202.

The resonant transformer circuit 202 is used for resonantly converting and transforming the alternating current power, and then outputting the same to the rectifier circuit 203.

The rectifier circuit 203 is used for rectifying alternating current output voltages outputted by the resonant transformer circuit 202 into direct current voltages for output, so as to supply power to the switch device.

In some embodiments, the inverter circuit 201 may convert direct current power into alternating current power (for example, a high-frequency square wave). The inverter circuit 201 includes a direct current positive input end, a direct current negative input end, an inverter output end 1, and an inverter output end 2. The direct current positive input end and the direct current negative input end are used for the input of the direct current power. The inverter circuit 201 may be a full-bridge inverter circuit (that includes, for example, four power switch tubes), or a half-bridge inverter circuit (that includes, for example, two power switch tubes), and the embodiments of the present application are not limited thereto. Additionally, the above switch tubes are a variety of power semiconductor switch devices including power MOS tubes, IGBTs, BJTs, thyristors, IGCTs, etc. The various devices and the connection relationships thereof in the inverter circuit 201 above are merely illustrative. Reference may be made to the related art for details, and the present application is not limited thereto.

Figure 3:
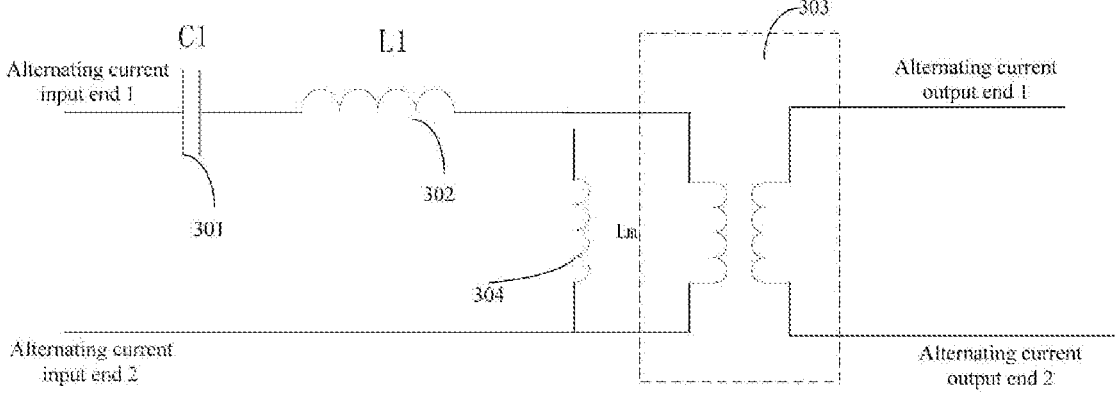
FIG. 3 is a schematic diagram of a resonant transformer circuit 202 according to embodiments of the present application.

In some embodiments, the inverter output end 1 and the inverter output end 2 of the inverter circuit 201 are connected to an alternating current input end 1 and an alternating current input end 2 of the resonant transformer circuit 202. The alternating current power (high-frequency square wave) outputted by the inverter circuit 201 is applied to the alternating current input end 1 and the alternating current input end 2 of the resonant transformer circuit 202, and generates high-frequency resonance, thus eliminating harmonics of the square wave, and outputting a sinusoidal wave of a fundamental frequency. The sinusoidal wave is transmitted by means of the transformer from a primary side to a secondary side, and after being boosted or reduced in voltage according to application requirements, the transformed sinusoidal wave is outputted to the rectifier circuit 203 by means of connections between an alternating current output end 1 and alternating current output end 2 and the rectifier circuit 203. FIG. 3 is a schematic diagram of the resonant transformer circuit 202 in the embodiments of the present application. As shown in FIG. 3, the resonant transformer circuit 202 includes a resonant capacitor (C1) 301, a resonant inductor (L1) 302, and an air-core transformer 303. The resonant capacitor 301 may be a quartz capacitor, but the embodiments of the present application are not limited thereto. The resonant inductor 302 may be a separate inductive device that is connected in series to the resonant capacitor 301 independent of the air-core transformer 303. Alternatively, the resonant inductor 302 is integrated in the air-core transformer 303, and can be regarded as a (primary) leakage inductor of the air-core transformer 303 (which is not a component that really exists, and can be regarded as a lumped circuit parasitic element that is inherent to the transformer), and is connected in series at the primary side of the transformer. Alternatively, one portion of the resonant inductor 302 is a separate inductive device that is connected in series to the resonant capacitor 301 independent of the air-core transformer 303, and the other portion thereof is integrated in the air-core transformer 303. FIG. 3 is merely for illustrating the effect of the presence of this resonant inductor 302, which is equivalent to being connected in series at the primary side of the transformer, but the embodiments of the present application are not limited thereto. In addition, it should be noted that an equivalent circuit model of the air-core transformer 303 includes an inherent lumped circuit parasitic element including a (primary) excitation inductor Lm 304, which is not a component that really exists. FIG. 3 is merely for illustrating the effect of the presence of the excitation inductor, which is equivalent to being connected in parallel at the primary side of the transformer. The present application does not limit the order of connection of the resonant inductor, the excitation inductor, and the resonant capacitor. For example, the excitation inductor may also be located in the middle of the resonant inductor and resonant capacitor, and examples are not further enumerated herein.

How to design the resonant capacitor 301, the resonant inductor 302, and the air-core transformer 303 above and the principles of the designs will be described below.

In some embodiments, the rectifier circuit 203 may convert the sinusoidal wave into stable direct current voltages for output, and may be a full-bridge rectifier circuit or a half-bridge rectifier circuit. The rectifier circuit 203 includes a first connection end, a second connection end, a direct current positive output end, and a direct current negative output end. The direct current positive output end and the direct current negative output end are used for the output of the direct current power, and the first connection end and the second connection end may be respectively connected to the alternating current output end 1 and the alternating current output end 2 of the resonant transformer circuit 202. The rectifier circuit 203 includes rectifier tubes. The rectifier tubes include at least one diode and/or at least one synchronous rectifier tube, that is, the rectifier tubes can all be diodes, or the rectifier tubes can all be synchronous rectifier tubes, or the rectifier tubes can be a combination of diodes and synchronous rectifier tubes. The various devices and the connection relationships thereof in the rectifier circuit 203 are merely illustrative. Reference may be made to the related art for details, and the present application is not limited thereto.

In some embodiments, the resonant power circuit 200 may further include an output capacitor 204. Two ends of the output capacitor 204 are respectively connected to the direct current positive output end and the direct current negative output end of the rectifier circuit 203, i.e., connected in parallel to the output ends of the rectifier circuit 203.

In some embodiments, the resonant power circuit satisfies the ratio of the switching frequency (also called an operating frequency) to the series resonant frequency of the resonant power circuit being greater than 1, the series resonant frequency being determined according to the resonant capacitor and the resonant inductor, so that the resonant power circuit can be designed as a non-feedback open-loop circuit (that cannot be tuned), and can operate in a zero voltage switching (ZVS) mode in a full range of loads under open-loop conditions, and reduce electromagnetic interference generated during the operation thereof, thus enabling the resonant power circuit to be applied in a high-frequency device in the scan room. The detailed description is provided below.

Figure 4:
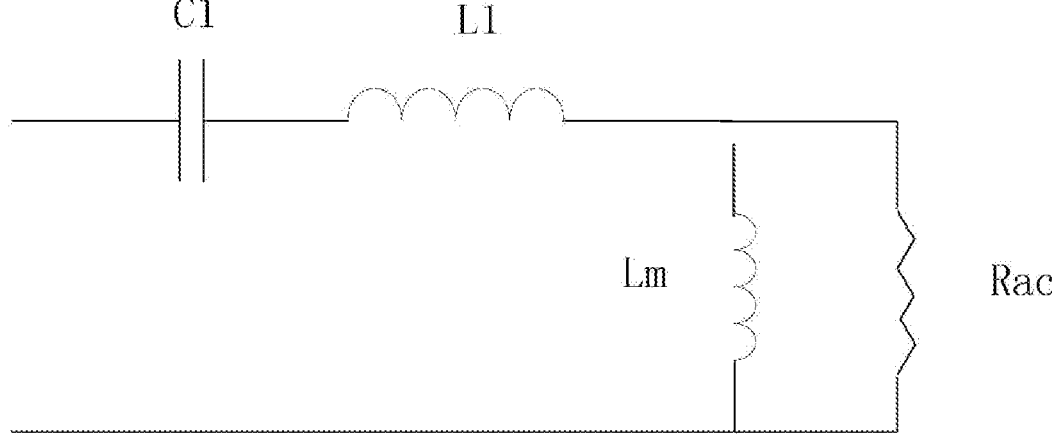
FIG. 4 is an equivalent schematic diagram of a circuit that generates resonance according to embodiments of the present application.

Currently, common switch tubes are all hard switches. A drain to source voltage and current of a switch tube may overlap when the switch tube is turned on and off, and the region in which the voltage and current overlap is the turn-on loss and the turn-off loss of the switch tube. In the embodiments of the present application, a method of ZVS soft switching is employed, that is, before turning on a switch, the voltage across the switch is made to be zero, i.e., the zero voltage switching. In order to implement ZVS, the current must lag behind the voltage of the switch tube, so that the resonant transformer circuit operates in an inductive state. FIG. 4 is an equivalent schematic diagram of a circuit that generates resonance. As shown in FIG. 4, $R_{ac}$ is an alternating equivalent load, and for the resonant circuit, there are two resonant frequencies, i.e., a series resonant frequency $$f_{r1} = \frac{1}{2 \times \pi \times \sqrt{C1 \times L1}}$$

and a series and parallel resonant frequency $$f_{r2} = \frac{1}{2 \times \pi \times \sqrt{C1 \times (L1 + Lm)}},$$

where C1 is the foregoing resonant capacitor, L1 is the foregoing resonant inductor (including at least one of a separate inductor and a primary inductor of the transformer), and Lm is the foregoing excitation inductor.

In other existing circuit designs, in order to satisfy ZVS, the series and parallel resonant frequency $f_{r2}$ is usually made to be less than a switching frequency $f_s$. In the embodiments of the present application, the switching frequency is determined by an external clock signal. Taking into consideration different parasitic parameters of different air-core transformers, the values of the resonant capacitor C1 and the resonant inductor L1 may be designed such that the series resonant frequency $f_{r1}$ satisfies being less than the switching frequency $f_s$ (i.e., the ratio x of the switching frequency to the series resonant frequency is greater than 1), so that the resonant power circuit achieves operation in the ZVS mode in the full range of loads under the open-loop conditions, and the generated electromagnetic interference is reduced.

In some embodiments, on the basis that the resonant power circuit achieves operation in the ZVS mode in the full range of loads under the open-loop conditions, the output voltages may drop (hereinafter simply referred to as a voltage drop) when the load changes from empty to full. In order to reduce the value of the drop such that the output voltages are more stable, the values of the resonant capacitor C1 and the resonant inductor L1 may be designed such that the ratio x of the switching frequency to the series resonant frequency is greater than 1 and less than a first threshold, where the first threshold may be a value that differs from 1 by less than a second threshold. The second threshold may be determined according to requirements, for example, the first threshold is 1.1 or 1.15, etc., and the embodiments of the present application are not limited thereto. That is, the values of the resonant capacitor C1 and the resonant inductor L1 are designed such that the ratio x of the switching frequency to the series resonant frequency is greater than 1 but approaches 1, or rather, such that the ratio x of the switching frequency to the series resonant frequency is greater than 1 and becomes smaller (as small as possible). In addition, a resistor Rd connected in parallel to the output capacitor 204 may be added at the output ends of the rectifier circuit 203, the working principle of which is described in detail below.

The gain curve function of the resonant power circuit may be represented using the following equation (1):

$$|G(f)| = \frac{kx^2}{\sqrt{\{(1+k) \times x^2 - 1\}^2 + \{Qk(x) \times [(x)^2 - 1]\}^2}} \qquad \text{Equation (1)}$$

where $k = Lm/L1$, $x = f_s/f_{r1}$, $Q = \dfrac{2\pi f_{r1} L1}{R_{ac}}$.

When the load is light, $R_{ac}$ can be regarded as an open circuit, at which point, the equivalent input impedance of the resonant transformer circuit $$Z = j\omega L1 + j\omega Lm - \frac{1}{j\omega C1},$$

and when the load is heavy, $R_{ac}$ can be regarded as a short circuit, at which point, the equivalent input impedance of the resonant transformer circuit $$Z = j\omega L1 - \frac{1}{j\omega C1}.$$

In the above two cases, resonance occurs when the inductive reactance is equal to the capacitive reactance, and the equivalent input impedance is resistive (an imaginary part is 0). When the equivalent input impedance is resistive, the corresponding gain curve function is $$G1 = \sqrt{\frac{k(f_s/f_{r1})^2}{\left|(1+k)(f_s/f_{r1})^2 - 1\right|}},$$

where the larger the value of Q, the heavier the load. The values of the resonant inductor and the resonant capacitor are designed, such that the ratio x of the switching frequency to the series resonant frequency and the gain value G of the resonant power circuit is such that the equivalent input impedance of the resonant transformer circuit is located in an inductive region, i.e., located on the right side of the gain curve G1, and x is greater than 1 but approaches 1, thereby ensuring that the resonant power circuit operates in the ZVS mode, and the value of the drop in the output voltages caused by a change in load is reduced, so that the output voltages are more stable. For example, the values of the resonant inductor and the resonant capacitor are designed, such that the ratio of the switching frequency to the resonant frequency is 1.06, which is only used as an example here, and the embodiments of the present application are not limited thereto.

In addition, the value of the foregoing resistor Rd that is connected in parallel may be less than a third threshold, and the resistor Rd may be regarded as an added small load for the circuit. For example, the value of the resistor may be less than 10 kohm, such as the value of the resistor being 1.5 kohm or 2 kohm or 1 kohm, etc., and the embodiments of the present application are not limited thereto. The third threshold may be determined according to requirements. As described previously, when operating in the ZVS mode under the open-loop conditions, the resonant power circuit output voltages that may drop when the load changes from empty to heavy or full. By means of connecting a small load (i.e., the resistor Rd) in parallel at the output ends of the resonant power circuit, the circuit load changes from light to heavy or full after an actual external load is connected, and will not directly change from empty to heavy or full, thus, the value of the voltage drop produced by the change in load is further reduced.

In some embodiments, the air-core transformer 303 is suitable for the structure of any air-core transformer. However, in order to further achieve good magnetic coupling between a primary winding and a secondary winding, thereby reducing parasitic capacitance between the primary winding and the secondary winding and maintaining good EMI performance, the embodiments of the present application further provide a multilayer flexible printed circuit or printed circuit board winding transformer, the transformer including a primary winding and a secondary winding embedded in the multilayer flexible printed circuit or printed circuit board, wherein the secondary winding and the primary winding are magnetically coupled. The primary winding and the secondary winding are respectively embedded in different layers of the multilayer flexible printed circuit or printed circuit board.

Figure 5:
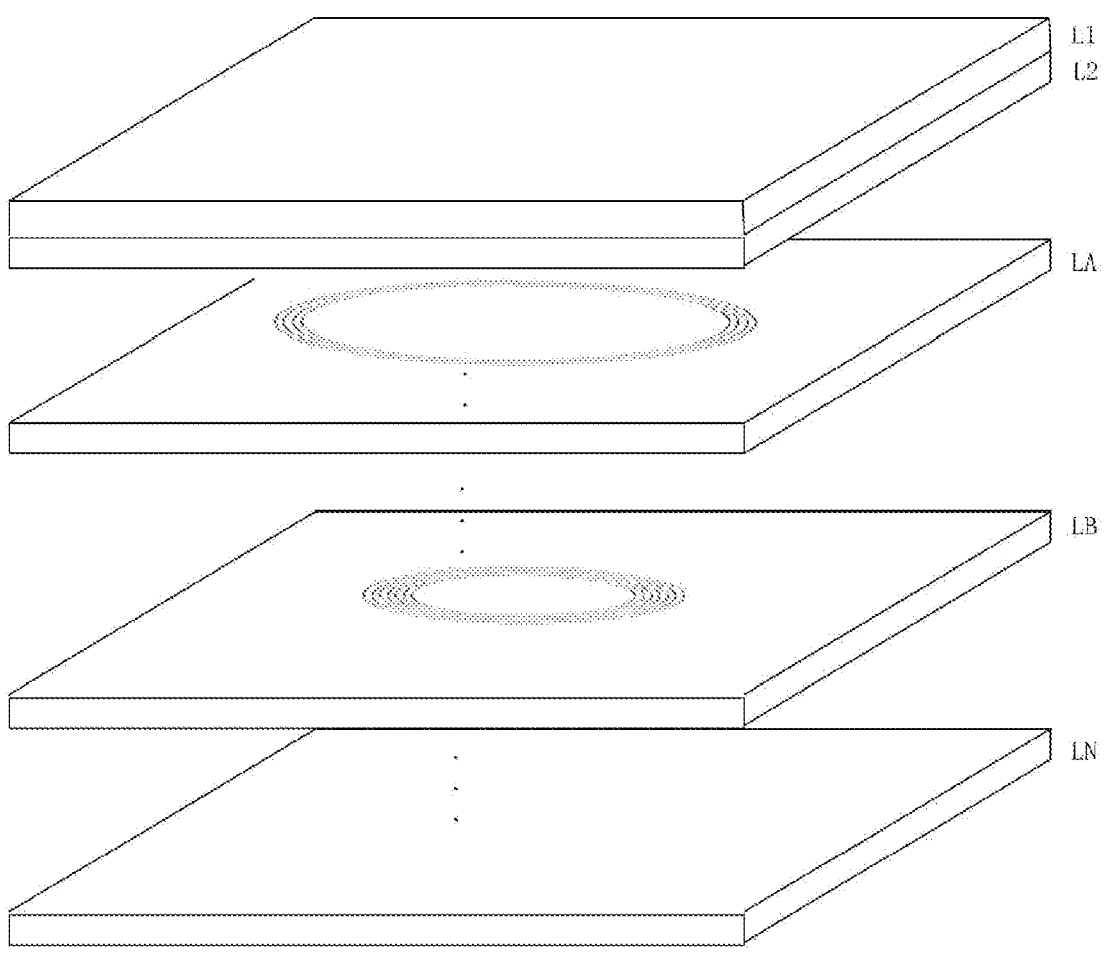
FIG. 5 is a schematic diagram of an air-core transformer according to embodiments of the present application.

FIG. 5 is a cross-sectional schematic diagram (a schematic diagram of layers after separation) of a transformer in a first direction according to the embodiments of the present application, the first direction being a layer thickness direction. As shown in FIG. 5, the transformer includes a flexible printed circuit or printed circuit board of a plurality of layers: layers L1, L2, . . . , LN, and a primary winding embedded in an LA layer and a secondary winding embedded in an LB layer of the multilayer flexible printed circuit or printed circuit board. Each layer of flexible printed circuit or printed circuit board described above is made into one multilayer flexible printed circuit or printed circuit board by means of a stack-of-layers (stacking) pressing process.

In some embodiments, the layers in which the primary winding and the secondary winding are located are not adjacent. In order to further reduce the parasitic capacitance, the higher the number of layers spaced between the layer in which the primary winding is located and the layer in which the secondary winding is located, the better. For example, the number of layers spaced between the layer in which the primary winding is located and the layer in which the secondary winding is located is greater than a first number that may be determined according to N. That is, the distance between LA and LB may be made as far as possible. For example, LA is the L1 layer and LB is the LN layer. The embodiments of the present application are not limited thereto. Thus, the parasitic capacitance may be further reduced.

Figure 6:
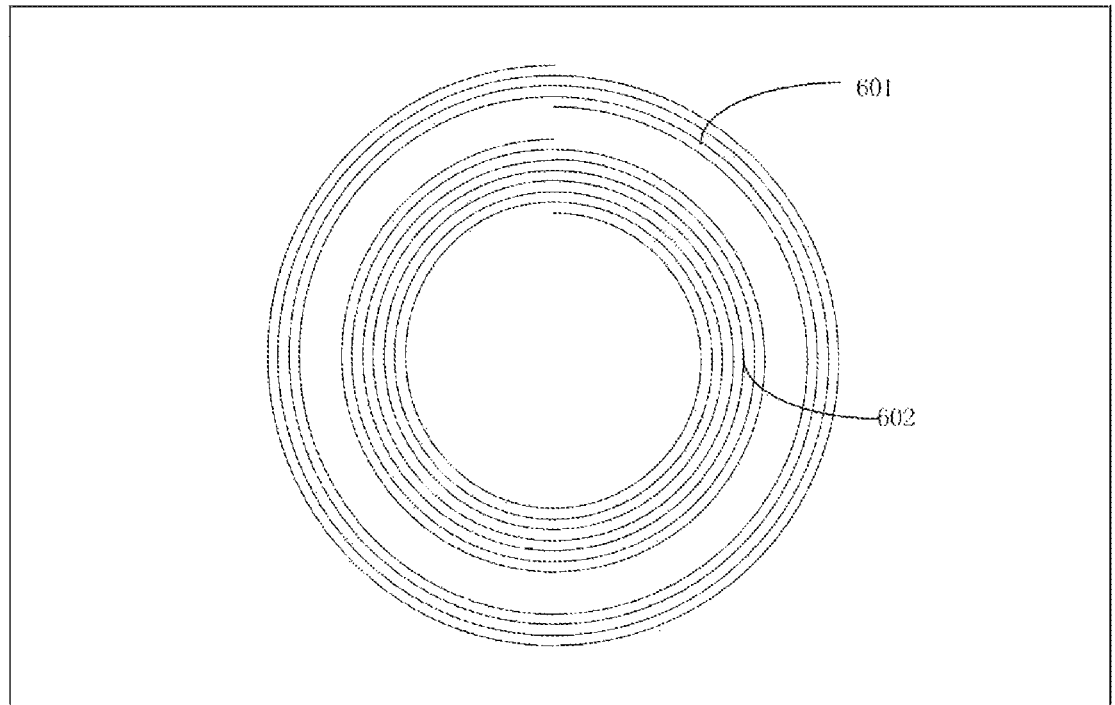
FIG. 6 is a perspective view of a multilayer board of the transformer viewed in a direction towards a layer surface according to embodiments of the present application.

In some embodiments, central positions of a primary coil constituting the primary winding and a secondary coil constituting the secondary winding overlap, and the primary coil is located outside of the secondary coil and does not overlap with the secondary coil, thereby further reducing the parasitic capacitance. FIG. 6 is a perspective view of a multilayer board of the transformer viewed in a direction towards a layer surface according to the embodiments of the present application. As shown in FIG. 6, central positions of a primary coil 601 and secondary coil 602 located in different layers overlap in the layer thickness direction of the multilayer board, but the primary coil and the secondary coil are fully separated, and in a direction parallel to the layer surface, all of the primary coil 601 is located outside of all of the secondary coil 602.

Figure 7:
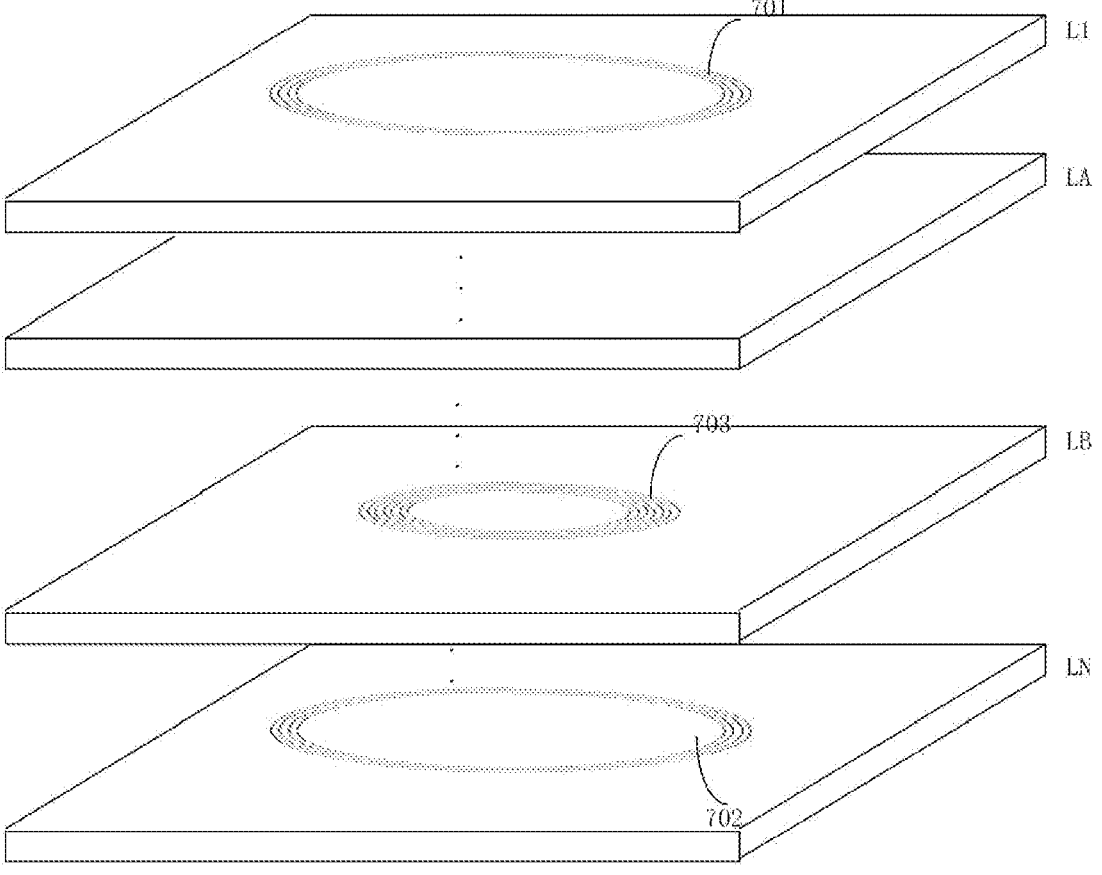
FIG. 7 is a cross-sectional schematic diagram of a transformer in a first direction according to embodiments of the present application.

In some embodiments, the primary winding includes a first coil group and a second coil group respectively embedded in different layers of the multilayer flexible printed circuit or printed circuit board, and the layer in which the secondary winding is located is located between the layers in which the first coil group and the second coil group are respectively located. Thus, the parasitic capacitance may be further reduced. For example, the first coil group and the second coil group are respectively embedded in a top layer and a bottom layer of the multilayer flexible printed circuit or printed circuit board, the number of turns of the first coil group and the second coil group are the same, and the positions thereof in the top and bottom layers overlap. FIG. 7 is a cross-sectional schematic diagram (a schematic diagram of layers after separation) of a transformer in a first direction according to the embodiments of the present application. As shown in FIG. 7, the transformer includes a flexible printed circuit or printed circuit board of a plurality of layers: L1, L2, . . . , LN, and a first coil group 701 of a primary winding embedded in the L1 layer of the multilayer flexible printed circuit or printed circuit board, a first coil group 702 of a primary winding embedded in the LN layer of the multilayer flexible printed circuit or printed circuit board, and a secondary winding 703 embedded in the LB layer, wherein LB is an intermediate layer located between L1 and LN, or close to the L1 layer, or close to the LN layer, and the embodiments of the present application are not limited thereto.

In some embodiments, similarly, the secondary winding may be split into at least two coil groups, but in order to avoid increasing interlayer parasitic capacitance, the at least two coil groups are not located in three adjacent layers. For example, the secondary winding is split into three coil groups 1, 2, and 3, which may be respectively located in second, third, and fifth layers, or second, fourth, and fifth layers, etc., but cannot be located in three adjacent consecutive layers, i.e., second, third, and fourth layers, or third, fourth, and fifth layers, etc.

In some embodiments, in order to achieve target output voltages, the ratio of the number of turns of the primary winding to that of the secondary winding may be obtained by means of calculation. Given a certain ratio of number of turns, in order to further reduce the parasitic capacitance, while the ratio of number of turns remains unchanged, the number of turns of the primary winding may be made as few as possible, such as less than a second number which may be determined according to the ratio of a required number of turns. The embodiments of the present application are not limited thereto. For example, the number of turns of the primary winding is designed such that same is the smallest number of turns when enabling the ratio of number of turns of the primary winding to that of the secondary winding to not change. For example, if the ratio of the number of turns of the primary winding to the secondary winding is 1:2, then the number of turns of the primary winding may be four, and the number of turns of the secondary winding may be eight, but in order to further reduce the parasitic capacitance, the number of turns of the primary winding may be modified to two, and the number of turns of the secondary winding may be modified to four.

In some embodiments, on the basis that the ratio of number of turns remains unchanged, reducing the number of turns may cause a change in excitation inductance. Therefore, a suitable excitation inductance value may be maintained by means of increasing the radius of each turn of coil, or increasing the inductance value of an inductive element independent of the transformer.

In some embodiments, more than one secondary winding may be provided according to the requirements of the output voltages, and each secondary winding is similarly designed. Please refer to the foregoing embodiments, which will not be described herein again.

For example, when the target output voltages are 15 V and −4 V, one primary winding P and two secondary windings M and F may be provided, wherein the secondary winding M may correspondingly generate the voltage of 15 V, and the secondary winding F may correspondingly generate the voltage of −4 V.

The following uses an eight-layer flexible printed circuit or printed circuit board as an example for illustrating how to design the primary winding P and the two secondary windings M and F. For example, a ratio of the number of turns of the primary winding P to the secondary winding M to the secondary winding F of 1:4:2 is obtained by means of calculation. A one-turn primary coil is designed in a first layer, and a one-turn primary coil is designed in an eighth layer. Positions of the primary coils of the first layer and the eighth layer overlap in a direction parallel to the layer surface. A four-turn secondary winding M is respectively designed in a third layer and a fourth layer. Secondary coils of the third layer and the fourth layer are located inside of the primary coils of the first layer and the eighth layer and do not overlap therewith in the direction parallel to the layer surface, but the central positions thereof overlap. A four-turn secondary winding F is designed in a sixth layer. A secondary coil of the sixth layer is located inside of the primary coils of the first layer and the eighth layer and does not overlap therewith in the direction parallel to the layer surface, but the central positions thereof overlap. Thus, a balance between good coupling between the primary side and the secondary side and a small parasitic capacitance are achieved.

The following used a six-layer flexible printed circuit or printed circuit board as an example for illustrating how to design the primary winding P and the two secondary windings M and F. For example, a ratio of the number of turns of the primary winding P to the secondary winding M to the secondary winding F of 1:4:2 is obtained by means of calculation. A one-turn primary coil is designed in a first layer, and a one-turn primary coil is designed in a sixth layer. Positions of the primary coils of the first layer and the sixth layer overlap in a direction parallel to the layer surface. A four-turn secondary winding M is respectively designed in a second layer and a third layer. Secondary coils of the second layer and the third layer are located inside of the primary coils of the first layer and the sixth layer and do not overlap therewith in the direction parallel to the layer surface, but the central positions thereof overlap. A four-turn secondary winding F is designed in a fifth layer. A secondary coil of the fifth layer is located inside of the primary coils of the first layer and the sixth layer and does not overlap therewith in the direction parallel to the layer surface, but the central positions thereof overlap. Thus, a balance between good coupling between the primary side and the secondary side and a small parasitic capacitance are achieved.

It should be noted that the above uses the coils being wound in a circular manner as an example for illustration. However, the embodiments of the present application are not limited thereto, and the coils may also be wound in a square or another shape. In addition, not all layers of the multilayer flexible printed circuit or printed circuit board need to have a primary coil or a secondary coil embedded therein. The layers that have the coils embedded therein may be also provided with coil pins (not shown), which, by means of through-holes provided in the layers, connect in parallel or in series the coils of the layers according to specifications and then connect same to the rectifier circuit, the resonant capacitor, the resonant inductor, and the inverter circuit. In addition, other electronic components may also be included on each layer of the flexible printed circuit or printed circuit board. Reference may be made to the related art for details, which are not further enumerated herein.

It can be seen from the above embodiments that by means of designing the parameters of the resonant power circuit such that the ratio of the switching frequency to the series resonant frequency thereof is greater than 1 and less than the first threshold, the resonant power circuit is suitable for the high-frequency device in the scan room of the magnetic resonance imaging system, achieves operation in the ZVS mode in the full range of loads under the open-loop conditions, and reduces the value of the drop in the output voltages caused by the change in load, so that the output voltages are more stable.

It can be seen from the above embodiments that by means of using the multilayer flexible printed circuit or printed circuit board winding transformer, respectively embedding the primary winding and the secondary winding in different layers of the multilayer flexible printed circuit or printed circuit board, and the primary coil being located outside of the secondary coil and not overlapping with the secondary coil, the problem in which conventional magnetic cores cannot operate in a strong magnetic field environment may be solved, and parasitic capacitance is reduced while good coupling between the primary side and the secondary side is achieved, thus, better suppression of electromagnetic interference can be obtained.

Figure 8:
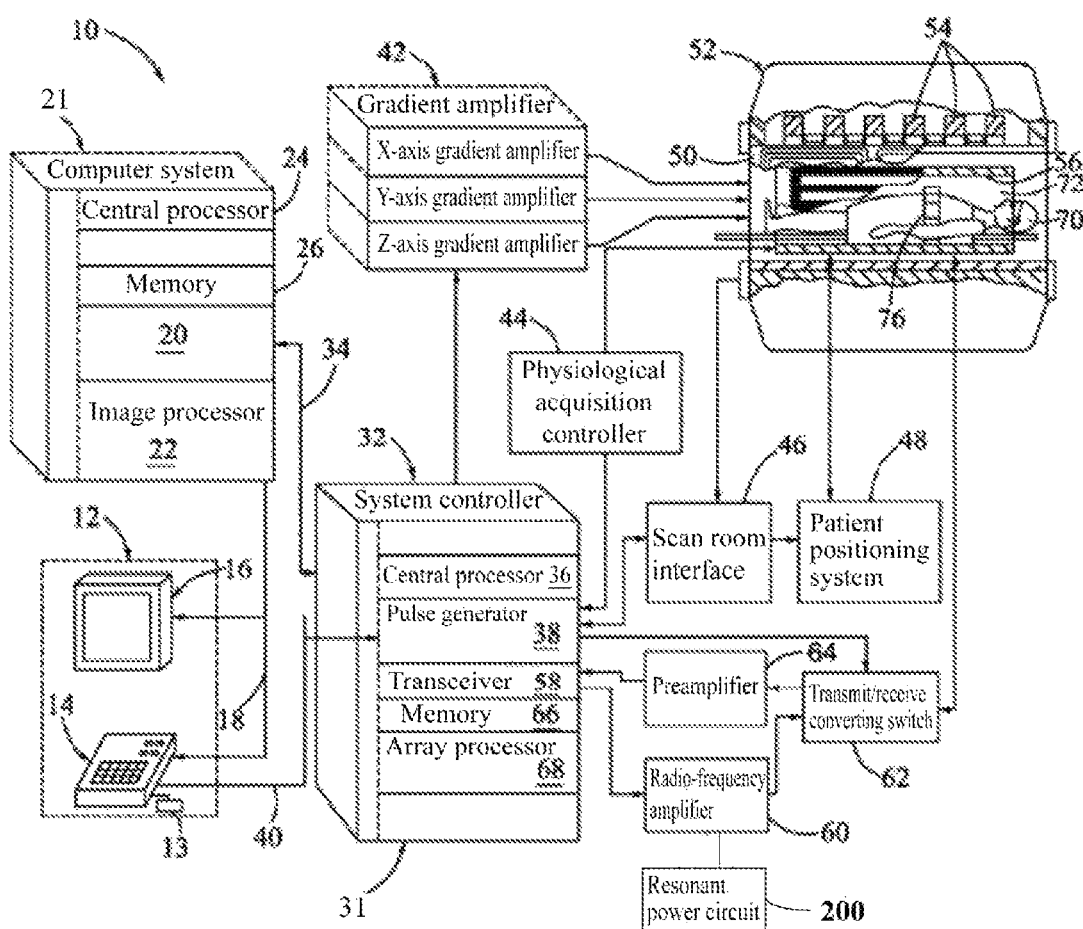
FIG. 8 is a schematic diagram of a magnetic resonance imaging system according to embodiments of the present application.

An embodiment of the present application further provides a magnetic resonance imaging system. The configuration of the magnetic resonance imaging system is as shown in FIG. 8, and similarities to FIG. 1 will not be repeated here.

In some embodiments, the magnetic resonance imaging system differs from the foregoing magnetic resonance imaging system in FIG. 1 in that the magnetic resonance imaging system further includes the resonant power circuit 200 of the foregoing embodiments, which is disposed within the scan room of the magnetic resonance imaging system, and used for supplying power to the switch device in the radio-frequency amplifier 60 of the magnetic resonance imaging system.

An embodiment of the present application further provides a magnetic resonance imaging system. The configuration of the magnetic resonance imaging system is as shown in FIG. 1, and similarities to FIG. 1 are not repeated here.

In some embodiments, the magnetic resonance imaging system differs from the foregoing magnetic resonance imaging system in FIG. 1 in that the magnetic resonance imaging system further includes the multilayer flexible printed circuit or printed circuit board winding transformer of the foregoing embodiments, which is disposed within the scan room of the magnetic resonance imaging system, and is applied in a power circuit that supplies power to components such as the radio-frequency amplifier or the gradient amplifier or a gate driver of the magnetic resonance imaging system.

The above apparatus and method of the present application can be implemented by hardware, or can be implemented by hardware in combination with software. The present application relates to the foregoing type of computer-readable program. When executed by a logic component, the program causes the logic component to implement the foregoing apparatus or a constituent component, or causes the logic component to implement various methods or steps as described above. The present application further relates to a storage medium for storing the above program, such as a hard disk, a disk, an optical disk, a DVD, a flash memory, etc.

The method/apparatus described in view of the embodiments of the present application may be directly embodied as hardware, a software module executed by a processor, or a combination of the two. For example, one or more of the functional block diagrams and/or one or more combinations of the functional block diagrams shown in the drawings may correspond to either respective software modules or respective hardware modules of a computer program flow. The foregoing software modules may respectively correspond to the steps shown in the figures. The foregoing hardware modules can be implemented, for example, by firming the software modules by using a field-programmable gate array (FPGA).

The software modules may be located in a RAM, a flash memory, a ROM, an EPROM, an EEPROM, a register, a hard disk, a portable storage disk, a CD-ROM, or any other form of storage medium known in the art. The storage medium may be coupled to a processor, so that the processor can read information from the storage medium and can write information into the storage medium. Alternatively, the storage medium may be a constituent component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory device, the software modules can be stored in the MEGA-SIM card or the large-capacity flash memory device.

One or more of the functional blocks and/or one or more combinations of the functional blocks shown in the accompanying drawings may be implemented as a general-purpose processor, a digital signal processor (DSP), an application-specific integrated circuit (ASIC), a field-programmable gate array (FPGA) or other programmable logic devices, discrete gate or transistor logic devices, a discrete hardware assembly, or any appropriate combination thereof for implementing the functions described in the present application. The one or more functional blocks and/or the one or more combinations of the functional blocks shown in the accompanying drawings may also be implemented as a combination of computing devices, such as a combination of a DSP and a microprocessor, multiple microprocessors, one or more microprocessors in communication combination with a DSP, or any other such configuration.

The present application is described above with reference to specific embodiments. However, it should be clear to those skilled in the art that the foregoing description is merely illustrative and is not intended to limit the scope of protection of the present application. Various variations and modifications may be made by those skilled in the art according to the principle of the present application, and said variations and modifications also fall within the scope of the present application.

The invention claimed is:

1. A resonant power circuit, disposed within a scan room of a magnetic resonance imaging system, and used for supplying power to a switch device in a radio-frequency amplifier of the magnetic resonance imaging system, wherein the resonant power circuit is physically coupled to the radio-frequency amplifier, the resonant power circuit comprising: an inverter circuit, a resonant transformer circuit, and a rectifier circuit;

the inverter circuit being connected to the resonant transformer circuit and used for converting inputted direct current power into alternating current power to be outputted to the resonant transformer circuit;

the resonant transformer circuit being used for resonantly converting and transforming the alternating current power, and then outputting the same to the rectifier circuit; and the rectifier circuit being used for rectifying alternating current output voltages outputted by the resonant transformer circuit into direct current voltages for output, so as to supply power to the switch device, wherein the resonant transformer circuit comprises a resonant capacitor and a resonant inductor, and the ratio of a switching frequency to a series resonant frequency of the resonant power circuit is greater than 1 and less than a first threshold, the series resonant frequency being determined according to the resonant capacitor and the resonant inductor.

2. A multilayer flexible printed circuit or printed circuit board winding transformer, comprising a primary winding and a secondary winding embedded in a multilayer flexible printed circuit or printed circuit board, wherein the primary winding and the secondary winding are respectively embedded in different layers of the multilayer flexible printed circuit or printed circuit board and are fully separated from each other, central positions of a primary coil constituting the primary winding and a secondary coil constituting the secondary winding overlap in a layer thickness direction of the multilayer flexible printed circuit or printed circuit board, and all of the primary coil is located outside all of the secondary coil in a direction parallel to a layer surface of the multilayer flexible printed circuit or printed circuit board, and the primary coil does not overlap with the secondary coil in the layer thickness direction.

3. The resonant power circuit according to claim 1, wherein the ratio of the switching frequency to the series resonant frequency and a gain value of the resonant power circuit are such that an equivalent input impedance of the resonant transformer circuit is located in an inductive region.

4. The resonant power circuit according to claim 1, wherein the resonant power circuit further comprises a resistor and an output capacitor that are connected in parallel to output ends of the rectifier circuit.

5. The resonant power circuit according to claim 1, wherein the resonant transformer circuit further comprises an air-core transformer, and the resonant inductor is connected in series to the resonant capacitor independent of the air-core transformer, or the resonant inductor is integrated into the air-core transformer.

6. The resonant power circuit according to claim 1, wherein the ratio of the switching frequency to the resonant frequency is 1.06.

7. A magnetic resonance imaging system, comprising:
a main magnet for generating a main magnetic field;
a gradient coil assembly;
a gradient amplifier for exciting the gradient coil assembly to generate a gradient magnetic field on a selected gradient axis so as to apply the gradient magnetic field to the main magnetic field;
a radio-frequency coil assembly;
a radio-frequency amplifier for exciting the radio-frequency coil assembly to generate a radio-frequency signal; and
the resonant power circuit according to claim 1, the resonant power circuit being disposed within a scan room of the magnetic resonance imaging system, and supplying power to a switch device in the radio-frequency amplifier.

8. The transformer according to claim 2, wherein the primary winding comprises a first coil group and a second coil group respectively embedded in different layers of the multilayer flexible printed circuit or printed circuit board, and the layer in which the secondary winding is located is located between the layers in which the first coil group and the second coil group are respectively located.

9. The transformer according to claim 2, wherein the layers in which the primary winding and the secondary winding are located are not adjacent.

10. The transformer according to claim 2, wherein the number of turns of the primary winding is the smallest number of turns when enabling the ratio of number of turns of the primary winding to that of the secondary winding to not change.

11. The transformer according to claim 2, wherein the secondary winding comprises at least two coil groups, the at least two coil groups not being located in three adjacent layers.

12. A magnetic resonance imaging system, comprising:
a main magnet for generating a main magnetic field;
a gradient coil assembly;
a gradient amplifier for exciting the gradient coil assembly to generate a gradient magnetic field on a selected gradient axis so as to apply the gradient magnetic field to the main magnetic field;
a radio-frequency coil assembly;
a radio-frequency amplifier for exciting the radio-frequency coil assembly to generate a radio-frequency signal;
a power circuit disposed within a scan room of the magnetic resonance imaging system, and supplying power to the radio-frequency amplifier or the gradient amplifier; and
the multilayer flexible printed circuit or printed circuit board winding transformer according to claim 2, the multilayer flexible printed circuit or printed circuit board winding transformer being disposed in the power circuit.

13. The resonant power circuit according to claim 5, wherein the air-core transformer is a multilayer flexible printed circuit or printed circuit board winding transformer, and the air-core transformer comprises a primary winding and a secondary winding embedded in a multilayer flexible printed circuit or printed circuit board.

14. The transformer according to claim 8, wherein the first coil group and the second coil group are respectively embedded in a top layer and a bottom layer of the multilayer flexible printed circuit or printed circuit board.

15. The resonant power circuit according to claim 13, wherein the primary winding and the secondary winding are respectively embedded in different layers of the multilayer flexible printed circuit or printed circuit board.

16. The resonant power circuit according to claim 13, wherein the primary winding comprises a first coil group and a second coil group respectively embedded in different layers of the multilayer flexible printed circuit or printed circuit board, and the layer in which the secondary winding is located is located between the layers in which the first coil group and the second coil group are respectively located.

17. The resonant power circuit according to claim 13, wherein the secondary winding comprises at least two coil groups, the at least two coil groups not being located in three adjacent layers.

18. The resonant power circuit according to claim 15, wherein the layers in which the primary winding and the secondary winding are located are not adjacent.

19. The resonant power circuit according to claim 15, wherein central positions of a primary coil constituting the primary winding and a secondary coil constituting the secondary winding overlap, and the primary coil is located outside of the secondary coil and does not overlap with the secondary coil.

20. The resonant power circuit according to claim 16, wherein the first coil group and the second coil group are respectively embedded in a top layer and a bottom layer of the multilayer flexible printed circuit or printed circuit board.

21. The resonant power circuit according to claim 18, wherein the number of turns of the primary winding is the smallest number of turns when enabling the ratio of number of turns of the primary winding to that of the secondary winding to not change.

* * * * *